US011365376B2

(12) United States Patent
Dory et al.

(10) Patent No.: US 11,365,376 B2
(45) Date of Patent: Jun. 21, 2022

(54) CLEANING COMPOSITIONS

(71) Applicant: Fujifilm Electronic Materials U.S.A., Inc., North Kingstown, RI (US)

(72) Inventors: Thomas Dory, Gilbert, AZ (US); Mick Bjelopavlic, Chandler, AZ (US); Joshua Guske, Mesa, AZ (US); Kazutaka Takahashi, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 17/585,054

(22) Filed: Jan. 26, 2022

(65) Prior Publication Data
US 2022/0145221 A1    May 12, 2022

Related U.S. Application Data

(63) Continuation of application No. 16/923,535, filed on Jul. 8, 2020, now Pat. No. 11,279,903, which is a continuation of application No. 16/278,875, filed on Feb. 19, 2019, now Pat. No. 10,752,867.

(60) Provisional application No. 62/649,029, filed on Mar. 28, 2018.

(51) Int. Cl.
| | | |
|---|---|---|
| C11D 3/43 | (2006.01) | |
| C11D 7/32 | (2006.01) | |
| C11D 7/06 | (2006.01) | |
| H01L 21/02 | (2006.01) | |
| C11D 7/34 | (2006.01) | |
| C11D 7/26 | (2006.01) | |

(52) U.S. Cl.
CPC .............. *C11D 7/3281* (2013.01); *C11D 7/06* (2013.01); *C11D 7/261* (2013.01); *C11D 7/34* (2013.01); *H01L 21/02043* (2013.01)

(58) Field of Classification Search
CPC ................................................ C11D 11/0047
USPC ........................................................ 510/175
See application file for complete search history.

(56) References Cited

U.S. PATENT DOCUMENTS

| | | | |
|---|---|---|---|
| 5,795,702 A | 8/1998 | Tanabe et al. | |
| 6,194,366 B1 | 2/2001 | Naghshineh et al. | |
| 6,265,781 B1 | 7/2001 | Andreas | |
| 6,287,586 B1 | 9/2001 | Orvig et al. | |
| 6,303,557 B1 | 10/2001 | Colclough | |
| 6,310,020 B1 | 10/2001 | Shirota et al. | |
| 6,447,563 B1 | 9/2002 | Mahulikar | |
| 6,599,370 B2 | 7/2003 | Skee | |
| 6,602,440 B2 | 8/2003 | Bishop et al. | |
| 6,627,587 B2 | 9/2003 | Naghshineh et al. | |
| 6,740,589 B2 | 5/2004 | Shimazu et al. | |
| 6,773,873 B2 | 8/2004 | Seijo et al. | |
| 6,869,921 B2 | 3/2005 | Koito et al. | |
| 6,951,710 B2 | 10/2005 | Rieker et al. | |
| 6,958,312 B2 | 10/2005 | Chae et al. | |
| 7,312,186 B2 | 12/2007 | Takashima et al. | |
| 7,365,045 B2 | 4/2008 | Walker et al. | |
| 7,387,964 B2 | 6/2008 | So et al. | |
| 7,456,140 B2 | 11/2008 | Small et al. | |
| 7,671,001 B2 | 3/2010 | Skee | |
| 7,700,533 B2 | 4/2010 | Egbe et al. | |
| 7,922,823 B2 | 4/2011 | Walker et al. | |
| 8,092,707 B2 | 1/2012 | Hardy et al. | |
| 8,114,220 B2 | 2/2012 | Visintin et al. | |
| 8,236,485 B2 | 8/2012 | Minsek et al. | |
| 8,361,237 B2 | 1/2013 | Wu et al. | |
| 8,404,626 B2 | 3/2013 | Kolics et al. | |
| 9,045,717 B2 | 6/2015 | Nakanishi et al. | |
| 9,562,211 B2 | 2/2017 | Takahashi et al. | |
| 10,253,282 B2 | 4/2019 | Takahashi et al. | |
| 10,415,005 B2 | 9/2019 | Takahashi et al. | |
| 10,533,146 B2 | 1/2020 | Park et al. | |
| 10,696,933 B2 | 6/2020 | Takahashi et al. | |
| 10,752,867 B2 | 8/2020 | Dory et al. | |
| 10,927,329 B2 | 2/2021 | Takahashi et al. | |
| 2001/0025017 A1 | 9/2001 | Amemiya et al. | |
| 2002/0077259 A1 | 6/2002 | Skee | |
| 2003/0228990 A1 | 12/2003 | Lee et al. | |
| 2003/0232799 A1 | 12/2003 | Wang et al. | |
| 2004/0048761 A1 | 3/2004 | Ikemoto | |
| 2004/0134873 A1 | 7/2004 | Yao et al. | |
| 2005/0176602 A1 | 8/2005 | Hsu | |
| 2005/0263743 A1 | 12/2005 | Lee | |
| 2006/0014391 A1 | 1/2006 | Lee et al. | |
| 2006/0094613 A1 | 5/2006 | Lee | |
| 2006/0115970 A1 | 6/2006 | Lee et al. | |
| 2006/0205623 A1 | 9/2006 | Oowada et al. | |
| 2006/0293208 A1 | 12/2006 | Egbe et al. | |
| 2007/0060490 A1 | 3/2007 | Skee | |
| 2007/0235061 A1 | 10/2007 | Mizuta et al. | |

(Continued)

FOREIGN PATENT DOCUMENTS

| | | | |
|---|---|---|---|
| CN | 1488740 | 4/2004 | ............... C11D 7/32 |
| CN | 1831654 | 9/2006 | ............... G03F 7/42 |

(Continued)

OTHER PUBLICATIONS

Notification of First Office Action and Search Report issued by the Chinese Patent Office for Application No. CN 201980021716.0, dated Apr. 14, 2022 (with English Translation).
"Declaration of Alexander Glew, Ph.D. in Support of Petition for Post Grant Review of U.S. Pat. No. 10,927,329", *Tokyo Ohka Kogyo Co., Ltd.* v. *FujiFilm Electronic Materials U.S.A., Inc,.* before the Patent Trial and Appeal Board, Case No. PGR2022-00010, dated Nov. 22, 2021.
"Intel 2020 Supplier Continuous Quality Improvement Awards", *Intel Newsroom*, (Mar. 30, 2021).
"Intel Announces 2018 Supplier Continuous Quality Improvement Awards", *Intel Newsroom*, (Mar. 7, 2019).

(Continued)

*Primary Examiner* — Gregory E Webb
(74) *Attorney, Agent, or Firm* — Fish & Richardson P.C.

(57) ABSTRACT

This disclosure relates to a cleaning composition that contains 1) hydroxylamine, 2) an amino alcohol, 3) hexylene glycol, and 4) water.

19 Claims, No Drawings

(56) References Cited

U.S. PATENT DOCUMENTS

| | | |
|---|---|---|
| 2008/0004197 A1 | 1/2008 | Kneer |
| 2008/0026583 A1 | 1/2008 | Hardy et al. |
| 2008/0039356 A1 | 2/2008 | Palmer et al. |
| 2008/0051308 A1 | 2/2008 | Kane |
| 2008/0076688 A1 | 3/2008 | Barnes et al. |
| 2008/0139436 A1 | 6/2008 | Reid |
| 2008/0214006 A1 | 9/2008 | Lee et al. |
| 2009/0107520 A1 | 4/2009 | Lee et al. |
| 2009/0120457 A1 | 5/2009 | Naghshineh et al. |
| 2009/0203566 A1 | 8/2009 | Lee et al. |
| 2009/0281017 A1 | 11/2009 | Suzuki et al. |
| 2009/0286708 A1 | 11/2009 | Murakami et al. |
| 2009/0301996 A1 | 12/2009 | Visintin et al. |
| 2010/0043823 A1 | 2/2010 | Lee |
| 2010/0056409 A1 | 3/2010 | Walker et al. |
| 2010/0152086 A1 | 6/2010 | Wu et al. |
| 2010/0163788 A1 | 7/2010 | Visintin et al. |
| 2011/0076852 A1 | 3/2011 | Takahashi et al. |
| 2011/0237480 A1 | 9/2011 | Mizutani et al. |
| 2012/0021961 A1 | 1/2012 | Klipp et al. |
| 2012/0048295 A1 | 3/2012 | Du et al. |
| 2012/0090646 A1 | 4/2012 | Tanaka et al. |
| 2012/0157368 A1 | 6/2012 | Mizuta et al. |
| 2012/0283163 A1 | 11/2012 | Barnes et al. |
| 2013/0061882 A1 | 3/2013 | Wu et al. |
| 2013/0288436 A1 | 10/2013 | Chou et al. |
| 2013/0296214 A1 | 11/2013 | Barnes et al. |
| 2013/0296215 A1 | 11/2013 | Rao et al. |
| 2014/0109931 A1 | 4/2014 | Lee et al. |
| 2015/0162213 A1 | 6/2015 | Chen et al. |
| 2016/0130500 A1 | 5/2016 | Chen et al. |
| 2016/0179011 A1 | 6/2016 | Agarwal et al. |
| 2018/0272386 A1* | 9/2018 | McAlpin ............... B08B 3/08 |
| 2019/0241845 A1 | 8/2019 | Takahashi et al. |
| 2019/0300825 A1 | 10/2019 | Dory et al. |
| 2020/0048584 A1 | 2/2020 | Takahashi et al. |
| 2020/0332231 A1 | 10/2020 | Dory et al. |
| 2020/0377829 A1 | 12/2020 | Takahashi et al. |

FOREIGN PATENT DOCUMENTS

| | | | |
|---|---|---|---|
| CN | 1875325 | 12/2006 | ............... G03F 7/42 |
| CN | 1904016 | 1/2007 | ............... C11D 7/32 |
| CN | 101916052 | 12/2010 | ............... G03F 7/42 |
| CN | 102031204 | 4/2011 | ............... G03F 7/42 |
| CN | 102477359 A | 5/2012 | ............... C11D 7/26 |
| CN | 102770524 | 11/2012 | ............... C11D 3/37 |
| DE | 198 49 648 | 5/2000 | ............... C11D 1/94 |
| EP | 1 755 003 | 2/2007 | ............... G03F 7/42 |
| EP | 2 305 788 | 4/2011 | ............... C11D 7/50 |
| EP | 2 500 407 | 9/2012 | ............ C11D 11/00 |
| EP | 3 104 398 | 12/2016 | |
| GB | 1 347 008 | 2/1974 | ............... C11D 7/32 |
| JP | H 03-000799 | 1/1991 | ............... C11D 7/50 |
| JP | H 11-006088 | 1/1999 | ............... C23G 5/02 |
| JP | 2003-15323 | 1/2003 | ............... G03F 7/42 |
| JP | 2004-511917 | 4/2004 | ............ H01L 21/304 |
| JP | 2005-223030 | 8/2005 | |
| JP | 2005-528660 | 9/2005 | ............... G03F 7/42 |
| JP | 2007-003617 | 1/2007 | ............... G03F 7/42 |
| JP | 2007-531902 | 11/2007 | ............... G03F 7/42 |
| JP | 2008-528762 | 7/2008 | ............... C11D 7/26 |
| JP | 2009-542849 | 12/2009 | ............... C11D 3/32 |
| JP | 2010-515246 | 5/2010 | ............ H01L 21/304 |
| JP | 2010-147476 | 7/2010 | ............ H01L 21/304 |
| JP | 2010-537404 | 12/2010 | ............ H01L 21/304 |
| JP | 2011-80042 | 4/2011 | ............... C11D 7/32 |
| JP | 2011-94100 | 5/2011 | ............... C11D 7/10 |
| JP | 2011-204909 | 10/2011 | ............ H01L 21/304 |
| JP | 2012-009513 | 1/2012 | ............ H01L 21/304 |
| JP | 2012-021151 | 2/2012 | ............... C11D 7/32 |
| JP | 2012-033774 | 2/2012 | ............ H01L 21/304 |
| JP | 2012-046685 | 3/2012 | ............... C11D 3/26 |
| JP | 2012-195590 | 10/2012 | ............ H01L 21/304 |
| JP | 2013-104104 | 5/2013 | ............... C23F 1/18 |
| KR | 2004-0023517 | 3/2004 | ............... A61K 7/50 |
| KR | 1020090000837 | 1/2009 | |
| KR | 1020120106928 | 9/2012 | ............... G03F 7/42 |
| TW | I227271 | 2/2005 | ............ C09K 13/00 |
| TW | 200710610 A | 3/2007 | ............... G03F 7/42 |
| TW | I315030 | 9/2009 | ............... G03F 7/42 |
| TW | 201137117 A | 11/2011 | ............... C11D 7/26 |
| TW | I362571 | 4/2012 | ............... G02F 1/13 |
| WO | WO 98/049723 | 11/1998 | ............ H01L 21/321 |
| WO | WO 2000/014193 | 3/2000 | ............... C11D 1/62 |
| WO | WO 2002/33033 | 4/2002 | ............... C11D 3/00 |
| WO | WO 2003/040252 | 5/2003 | |
| WO | WO 03/091376 | 11/2003 | ............... C11D 3/20 |
| WO | WO 2006/039090 | 4/2006 | ............... C23G 1/00 |
| WO | WO 2007/027522 | 3/2007 | ............... C11D 3/43 |
| WO | WO 2009/146606 | 12/2009 | ............... G03F 7/42 |
| WO | WO 2012/148967 | 11/2012 | |
| WO | WO 2012/161790 | 11/2012 | ............... C11D 3/43 |
| WO | WO 2013/058770 | 4/2013 | ............... C09K 3/14 |
| WO | WO 2013/101907 | 7/2013 | ............ H01L 21/311 |
| WO | WO 2014/197808 | 12/2014 | ............ C09K 13/00 |
| WO | WO 2017/023677 | 2/2017 | ............ C11D 11/00 |

OTHER PUBLICATIONS

"Intel Announces 2019 Supplier Continuous Quality Improvement Awards", *Intel Newsroom*, (Mar. 5, 2020).
"Tokyo Ohka Kogyo Co., LTD. Receives Intel's Preferred Quality Supplier Award", *2016 News Release* (2016).
European Office Action for European Application No. 14855311.8 dated Jul. 4, 2017 (8 pages).
European Search Report for European Application No. EP 16178830 dated Oct. 13, 2016 (2 pages).
Korean Office Action for South Korean Application No. 10-2016-7015325 Issued Feb. 13, 2018, 23 pages (with English Translation).
Notice of Reasons for Rejection from the Japanese Patent Office for Japanese Application No. 2016-536210 dated Oct. 17, 2017, 6 pages (with English Translation).
South Korean Office Action for South Korean Application No. 10-2016-7015325 dated Aug. 28, 2018 (with English translation), 19 pages.
Supplementary European Search Report for European Application No. EP 14855311 dated Jun. 8, 2017 (3 pages).
Supplementary European Search Report from the European Patent Office for European Application No. EP 14867771 by Examiner C. Agra-Gutierrez dated Aug. 31, 2017, 2 pages.
Taiwan Official Letter and Search Report for Taiwan Application No. 107146987 dated Jun. 19, 2019 (with English translation).
Taiwan Search Report for Taiwan Application No. 103142384 Dated May 31, 2017 (1 page).
The Chinese Office Action for Chinese Application No. CN 201810223834.7 dated Jun. 18, 2020 (with English Translation).
The Chinese Office Action for Chinese Application No. CN 201810223834.7 dated Sep. 3, 2019 with Machine Translation.
The Decision to Grant a Patent for Japanese Application No. JP 2016-525614, dated Sep. 3, 2019, 2 pages (English translation).
The European Office Action for European Application No. EP 16 178 8730.2 by Examiner Anne Szarowski dated Oct. 31, 2018, 7 pages.
The European Search Report for European Application No. EP 20 16 2184 by Examiner C. Agra-Gutierrez, dated Aug. 14, 2020.
The Final Office Action issued by the South Korean Patent Office for Application No. KR 10-2020-7008354 dated Dec. 18, 2020 (with English Translation).
The International Search Report and Written Opinion of the International Searching Authority for International Application No. PCT/US14/68294 dated Feb. 25, 2015 (18 pages).
The Korean Final Office Action for Korean Application No. KR 10-2019-7008832 dated Oct. 30, 2019 and English summary.
The Korean Office Action for Korean Application No. 10-2019-7008832 dated Apr. 29, 2019.
The Korean Office Action for Korean Application No. KR 10-2019-7008832 dated Dec. 24, 2019 (with English Translation).

(56) References Cited

OTHER PUBLICATIONS

The Korean Office Action for Korean Application No. KR 10-2020-7008354 dated Jun. 19, 2020 (with English Translation).
The Notice of Reasons for Refusal for Japanese Application No. 2019-039176 by Examiner Etsushi Yamamoto, dated Jun. 16, 2020 (with English Translation).
The Notice of Reasons for Refusal for Japanese Application No. JP 2016-525614, dated Jun. 4, 2019, 3 pages (English translation).
The Notice of Reasons for Refusal for Japanese Application No. JP 2016-525614, dated Sep. 4, 2018, 3 pages (English translation).
The Notice of Reasons for Refusal for Japanese Application No. JP 2019-039176 by Examiner Etsushi Yamamoto dated Jan. 14, 2020 (with English Translation).
The Petition for Post Grant Review of U.S. Pat. No. 10,927,329 fded before the Patent Trial and Appeal Broad, *Tokyo Ohka Kogyo Co., Ltd.* v. *FujiFilm Electronic Materials U.S.A., Inc.*, PGR2022-00010 (Nov. 22, 2021).
Curriculum Vitae of Alexander D. Glew, Ph.D., P.E.
Notification of Reasons for Refusal issued by the Korean Patent Office for Application No. KR 10-2021-7021104 dated Oct. 22, 2021 (with English Translation).
Office Action issued by the Korean Patent Office for Korean Application No. KR 10-2020-7008354 dated Apr. 13, 2021 (with English Translation).
Prosecution History excerpt for EP 3 104 398 A1.
Reinhardt et al., *Handbook of Cleaning for Semiconductor Manufacturing—Fundamentals and Applications*, Scrivener Publishing LLC, pp. 327-354 (2011).
Taiwan Search Report for Taiwan Application No. 106139015 dated Aug. 15, 2018, 1 page.
Vanzant, P., *Microchip Fabrication—A Practical Guide to Semiconductor Processing*, 5$^{th}$ Edition, McGraw-Hill Companies, Inc. New York, pp. 25-49; 71-137 (2004).
International Search Report and Written Opinion of the International Searching Authority for International Application No. PCT/US19/18508 dated May 3, 2019.
Supplementary European Search Report for European Application No. EP 19 77 8084 dated Apr. 9, 2021.
International Preliminary Report on Patentability for International Application No. PCT/US2019/018508, dated Oct. 8, 2020.
Curriculum Vitae of Dr. Reinhold H. Dauskardt.
Declaration of Reinhold H. Dauskardt filed with the United States Patent and Trademark Office Before the Patent Trial and Appeal Board, *Tokyo Ohka Kogyo Col. Ltd., Petitioner*, v. *FujiFilm Electronic Materials U.S.A., Inc.*, Patent Owner, Case No. PGR2022-00010; U.S. Pat. No. 10,927,329, dated Mar. 7, 2022.
File History excerpt of U.S. Appl. No. 14/558,767.
File History excerpt for U.S. Pat. No. 10,927,329.
He et al., "Mechanism of Co Liner as Enhancement Layer for Cu Interconnect Gap-Fill", *Journal of the Electrochemical Society*, vol. 160, No. 12, pp. D3040-D3044 (2013).
International Technology Roadmap for Semiconductors 2.0 2015 Edition Interconnect (2015).
Patent Owner Preliminary Response Pursuant to 37 C.F.R. § 42.207 filed with the United States Patent and Trademark Office Before the Patent Trial and Appeal Board, *Tokyo Ohka Kogyo Col. Ltd., Petitioner*, v. *FujiFilm Electronic Materials U.S.A., Inc.*, Patent Owner, Case No. PGR2022-00010; U.S. Pat. No. 10,927,329, filed on Mar. 8, 2022.
Patent Owner's Sur-Reply to Petitioner's Reply filed with the United States Patent and Trademark Office Before the Patent Trial and Appeal Board, *Tokyo Ohka Kogyo Col. Ltd., Petitioner*, v. *FujiFilm Electronic Materials U.S.A., Inc.*, Patent Owner, Case No. PGR2022-00010; U.S. Pat. No. 10,927,329, filed on Apr. 14, 2022.
Reply on Topics of Discretionary Denial Under 325(d) and Claim Construction filed with the United States Patent and Trademark Office Before the Patent Trial and Appeal Board, *Tokyo Ohka Kogyo Col., Ltd., Petitioner*, v. *FujiFilm Electronic Materials U.S.A., Inc.*, Patent Owner, Case No. PGR2022-00010; U.S. Pat. No. 10,927,329, Filed on Apr. 7, 2022.
Schor, "IEDM 2017 + ISSCC 2018: Intel's 10nm, switching to cobalt interconnects", *WikiChip Fuse*, (Feb. 17, 2018), *available at: https://fuse.wikichip.org/news/525/iedm-2017-isscc-2018-intels-10nmswitching-to-cobalt-interconnects/2/*.
Wolf et al., "Chapter 5, Contamination Control and Cleaning Technology for ULSI", *Silicon Processing for the VLSI Era*, vol. 1, Process Technology, Second Edition, Lattice Press, Sunset Beach, CA (2006).

\* cited by examiner

CLEANING COMPOSITIONS

CROSS-REFERENCE TO RELATED APPLICATIONS

The present application is a continuation of U.S. application Ser. No. 16/923,535, filed on Jul. 8, 2020, which is a continuation of U.S. application Ser. No. 16/278,875, filed on Feb. 19, 2019, now U.S. Pat. No. 10,752,867, which claims priority to U.S. Provisional Application Ser. No. 62/649,029, filed on Mar. 28, 2018. The contents of the prior applications are hereby incorporated by reference in their entirety.

TECHNICAL FIELD

The present disclosure relates to novel cleaning compositions for semiconductor substrates and methods of cleaning semiconductor substrates. More particularly, the present disclosure relates to cleaning compositions for semiconductor substrates after plasma etching of metal layers or dielectric material layers deposited on the substrates and the removal of residues left on the substrates after bulk resist removal via a plasma ashing process.

BACKGROUND

In the manufacture of integrated circuit devices, photoresists are used as an intermediate mask for transferring the original mask pattern of a reticle onto the wafer substrate by means of a series of photolithography and plasma etching steps. One of the essential steps in the integrated circuit device manufacturing process is the removal of the patterned photoresist films from the wafer substrate. In general, this step is carried out by one of two methods.

One method involves a wet stripping step in which the photoresist-covered substrate is brought into contact with a photoresist stripper solution that consists primarily of an organic solvent and an amine. However, such stripper solutions generally cannot completely and reliably remove the photoresist films, especially if the photoresist films have been exposed to UV radiation and plasma treatments during fabrication. Some photoresist films become highly cross-linked by such treatments and are more difficult to dissolve in a stripper solution. In addition, the chemicals used in these conventional wet-stripping methods are sometimes ineffective for removing inorganic or organometallic residual materials formed during the plasma etching of metal or oxide layers with halogen-containing gases.

An alternative method of removing a photoresist film involves exposing a photoresist-coated wafer to oxygen-based plasma in order to burn the resist film from the substrate in a process known as plasma ashing. However, plasma ashing is also not fully effective in removing the plasma etching by-products noted above. Instead, removal of these plasma etch by-products is typically accomplished by subsequently exposing the processed metal and dielectric thin films to certain cleaning solutions.

Metal-containing substrates are generally susceptible to corrosion. For example, substrates such as aluminum, copper, aluminum-copper alloy, tungsten nitride, tungsten, cobalt, titanium oxide, other metals and metal nitrides, will readily corrode. Further, dielectrics (e.g., interlayer dielectrics or ultra low-k dielectrics) in the integrated circuit devices can be etched by using conventional cleaning chemistries. In addition, the amount of corrosion tolerated by the integrated circuit device manufacturers is getting smaller and smaller as the device geometries shrink.

At the same time, as residues become harder to remove and corrosion must be controlled to ever lower levels, cleaning solutions should be safe to use and environmentally friendly.

Therefore, the cleaning solutions should be effective for removing the plasma etch and plasma ashing residues and should also be non-corrosive to all exposed substrate materials.

SUMMARY

The present disclosure is directed to non-corrosive cleaning compositions that are useful for removing residues (e.g., plasma etch and/or plasma ashing residues) from a semiconductor substrate as an intermediate step in a multistep manufacturing process. These residues include a range of relatively insoluble mixtures of organic compounds such as residual photoresist; organometallic compounds; metal oxides such as aluminum oxides (AlOx), titanium oxides (TiOx), zirconium oxides (ZrOx), tantalum oxides (TaOx), and hafnium oxides (HfOx) (which can be formed as reaction by-products from exposed metals); metals such as aluminum (Al), aluminum/copper alloy, copper (Cu), titanium (Ti), tantalum (Ta), tungsten (W), and cobalt (Co); metal nitrides such as aluminum nitrides (AlN), aluminum oxide nitrides (AlOxNy), titanium nitrides (TiN), tantalum nitrides (TaN), and tungsten nitrides (WN); their alloys; and other materials. An advantage of the cleaning composition described herein is that it can clean a broad range of residues encountered and be generally non-corrosive to exposed substrate materials (e.g., exposed metal oxides (such as AlOx), metals (such as aluminum, aluminum/copper alloy, copper, titanium, tantalum, tungsten, and cobalt), metal nitrides (such as titanium, tantalum, and tungsten nitrides), and their alloys).

In one aspect, the present disclosure features a cleaning composition comprising (e.g., consisting of or consisting essentially of): 1) at least one redox agent; 2) at least one alkylsulfonic acid or a salt thereof, the alkylsulfonic acid comprising an alkyl group substituted by OH or $NH_2$; 3) at least one aminoalcohol; 4) at least one corrosion inhibitor; 5) at least one organic solvent; 6) water; and 7) optionally, at least one pH adjusting agent.

In another aspect, the present disclosure features a cleaning composition comprising (e.g., consisting of or consisting essentially of): 1) at least one redox agent; 2) at least one aminoalcohol; 3) at least one corrosion inhibitor; 4) at least one organic solvent; 5) water; and 6) optionally, at least one pH adjusting agent.

In another aspect, the present disclosure features a method of cleaning residues from a semiconductor substrate. The method includes contacting a semiconductor substrate containing post etch residues and/or post ash residues with a cleaning composition described herein. For example, the method can include the steps of: (A) providing a semiconductor substrate containing post etch and/or post ash residues; (B) contacting said semiconductor substrate with a cleaning composition described herein; (C) rinsing said semiconductor substrate with a suitable rinse solvent; and (D) optionally, drying said semiconductor substrate by any means that removes the rinse solvent and does not compromise the integrity of said semiconductor substrate.

The details of one or more embodiments of the invention are set forth in the description below. Other features, objects, and advantages of the invention will be apparent from the description and the claims.

DETAILED DESCRIPTION

As defined herein, unless otherwise noted, all percentages expressed should be understood to be percentages by weight to the total weight of the cleaning composition. Unless otherwise noted, ambient temperature is defined to be between about 16 and about 27 degrees Celsius (° C.), such as 25° C.

As used herein, the terms "layer" and "film" are used interchangeably.

As defined herein, a "water-soluble" substance (e.g., a water-soluble alcohol, ketone, ester, or ether) refers to a substance having a solubility of at least 0.1% by weight in water at 25° C.

In general, the present disclosure is directed to a cleaning composition (e.g., a non-corrosive cleaning composition) including: 1) at least one redox agent; 2) at least one alkylsulfonic acid or a salt thereof, the alkylsulfonic acid comprising an alkyl group substituted by OH or $NH_2$; 3) at least one aminoalcohol; 4) at least one corrosion inhibitor; 5) at least one organic solvent (e.g., at least one water soluble organic solvent selected from the group consisting of water soluble alcohols, water soluble ketones, water soluble esters, and water soluble ethers); 6) water; and 7) optionally, at least one pH adjusting agent.

In some embodiments, the compositions of this disclosure contain at least one (e.g., two, three, or four) redox agent, which is believed to aid in the dissolution of residues on the semiconductor surface such as photoresist residues, metal residues, and metal oxide residues. As used herein, the term "redox agent" refers to a compound that can induce an oxidation and/or a reduction in a semiconductor cleaning process. An example of a suitable redox agent is hydroxylamine. In some embodiments, the redox agent or the cleaning composition described herein does not include a peroxide (e.g., hydrogen peroxide).

In some embodiments, the at least one redox agent can be at least about 6% by weight (e.g., at least about 7% by weight, at least about 8% by weight, at least about 9% by weight, at least about 10% by weight, at least about 11% by weight, or at least about 12% by weight) and/or at most about 15% by weight (e.g., at most about 14% by weight, at most about 13% by weight, at most about 12% by weight, at most about 11% by weight, or at most about 10% by weight) of the cleaning compositions of this disclosure.

In some embodiments, the cleaning compositions of this disclosure include the at least one (e.g., two, three, or four) alkylsulfonic acid or a salt thereof, the alkylsulfonic acid containing an alkyl group substituted by OH or $NH_2$. In some embodiments, the at least one alkylsulfonic acid includes an alkylsulfonic acid of formula (I):

R—$SO_3$H     (I), in which R is $C_1$-$C_{10}$ alkyl substituted by at least one substituent selected from the group consisting of OH and $NH_2$. In some embodiment, R is $C_1$-$C_4$ alkyl substituted by at least one OH. For example, the at least one alkylsulfonic acid or a salt thereof (e.g., a salt free of metal ions such as alkali metal ions) can include HO($CH_2$)$_2$$SO_3$H or HO($CH_2$)$_2$$SO_3$$NH_4$. In some embodiments, the cleaning compositions of this disclosure do not contain the above alkylsulfonic acid or a salt thereof (e.g., an salt containing a metal ion such as an alkali metal ion).

In some embodiments, the at least one alkylsulfonic acid or a salt thereof can be at least about 0.3% by weight (e.g., at least about 0.4% by weight, at least about 0.5% by weight, at least about 0.6% by weight, at least about 0.7% by weight, at least about 0.8% by weight, at least about 0.9% by weight, at least about 1% by weight, at least about 1.5% by weight, or at least about 2% by weight) and/or at most about 5% by weight (e.g., at most about 4% by weight, at most about 3% by weight, at most about 2% by weight, at most about 1.5% by weight, at most about 1.2% by weight, or at most about 1% by weight) of the cleaning compositions of this disclosure. Without wishing to be bound by theory, it is believed that a cleaning composition including the alkylsulfonic acid or a salt thereof in the amount specified above can reduce the corrosion effects of the composition on certain exposed substrate materials (e.g., AlOx) that are not intended to be removed during the cleaning process (e.g., by lowering the etch rates of the cleaning composition on such exposed substrate materials).

In some embodiments, the cleaning compositions of this disclosure contain at least one (e.g., two, three, or four) aminoalcohol. As used herein, the term "aminoalcohol" refers to a compound that include at least one (e.g., two, three, or four) amino group and at least one (e.g., two, three, or four) hydroxyl group. In some embodiments, the aminoalcohol can be a compound of formula (I): $H_2N$—R—OH (I), in which R is $C_1$-$C_6$ straight or branched alkylene or oxyalkylene. Examples of suitable aminoalcohols include ethanolamine and 2-(2-aminoethoxy)ethanol.

In some embodiments, the at least one aminoalcohol can be at least about 5% by weight (e.g., at least about 5.5% by weight, at least about 6% by weight, at least about 6.5% by weight, at least about 7% by weight, or at least about 7.5% by weight) and/or at most about 10% by weight (e.g., at most about 9.5% by weight, at most about 9% by weight, at most about 8.5% by weight, or at most about 8% by weight) of the cleaning compositions of this disclosure. Without wishing to be bound by theory, it is believed that the aminoalcohols can aid in the dissolution of residues on the semiconductor surface (such as photoresist residues, metal residues, and metal oxide residues) by, for example, serving as an oxidizing agent, hydrogen bonding with hydroxylamine to make it more effective in the cleaning compositions, swelling/dissolving the etch residue, or a combination of the above mechanisms.

In some embodiments, the cleaning compositions of this disclosure contain at least one (e.g., two, three, or four) corrosion inhibitor. In some embodiments, the corrosion inhibitors can be selected from substituted or unsubstituted benzotriazoles. Without wishing to be bound by theory, it is believed that such cleaning compositions can exhibit significantly improved compatibility with materials (e.g., AlOx or Co) that may be present in the semiconductor substrate and should not be removed by the cleaning compositions, when compared to cleaning compositions without any corrosion inhibitor.

Suitable classes of substituted benzotriazole include, but are not limited to, benzotriazoles substituted by at least one substituent selected from the group consisting of alkyl groups, aryl groups, halogen groups, amino groups, nitro groups, alkoxy groups, and hydroxyl groups. Substituted benzotriazoles also include those fused with one or more aryl (e.g., phenyl) or heteroaryl groups.

Suitable examples of a corrosion inhibitor include, but are not limited to, benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-n itrobenzotriazole, 4-n itrobenzotriazole, 3-amino-5-mercapto-1,2,4-triazole, 2-(5-amino-pentyl)-benzotriazole, 1-amino-benzotriazole, 5-methylbenzotriazole, benzotriazole-5-carboxylic acid, 4-m ethylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-m ethoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-dimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

In some embodiments, the at least one corrosion inhibitor can be at least about 0.1% by weight (e.g., at least about 0.2% by weight, at least about 0.3% by weight, at least about 0.4% by weight, or at least about 0.5% by weight) and/or at most about 2% by weight (e.g., at most about 1.8% by weight, at most about 1.6% by weight, at most about 1.4% by weight, at most about 1.2% by weight, or at most about 1% by weight) of the cleaning compositions of this disclosure.

In some embodiments, the cleaning compositions of this disclosure contain at least one (e.g., two, three, four, or more) organic solvent, e.g., at least one water soluble organic solvent selected from the group consisting of water soluble alcohols, water soluble ketones, water soluble esters, and water soluble ethers (e.g., glycol diethers).

Classes of water soluble alcohols include, but are not limited to, alkane diols (including, but not limited to, alkylene glycols), glycols, alkoxyalcohols (including, but not limited to, glycol monoethers), saturated aliphatic monohydric alcohols, unsaturated non-aromatic monohydric alcohols, and low molecular weight alcohols containing a ring structure. Examples of water soluble alkane diols includes, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycols. Examples of water soluble alkylene glycols include, but are not limited to, ethylene glycol, propylene glycol, hexylene glycol, diethylene glycol, dipropylene glycol, triethylene glycol and tetraethylene glycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers. Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to, methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to, allyl alcohol, propargyl alcohol, 2-butenyl alcohol, 3-butenyl alcohol, and 4-penten-2-ol.

Examples of water soluble, low molecular weight alcohols containing a ring structure include, but are not limited to, tetrahydrofurfuryl alcohol, furfuryl alcohol, and 1,3-cyclopentanediol.

Examples of water soluble ketones include, but are not limited to, acetone, cyclobutanone, cyclopentanone, diacetone alcohol, 2-butanone, 2,5-hexanedione, 1,4-cyclohexanedione, 3-hydroxyacetophenone, 1,3-cyclohexanedione, and cyclohexanone.

Examples of water soluble esters include, but are not limited to, ethyl acetate, glycol monoesters such as ethylene glycol monoacetate and diethylene glycol monoacetate, and glycol monoether monoesters such as propylene glycol monomethyl ether acetate, ethylene glycol monomethyl ether acetate, propylene glycol monoethyl ether acetate, and ethylene glycol monoethyl ether acetate.

In some embodiments, the at least one organic solvent can be at least about 30% by weight (e.g., at least about 35% by weight, at least about 40% by weight, or at least about 45% by weight) and/or at most about 50% by weight (e.g., at most about 45% by weight, at most about 40% by weight, or at most about 30% by weight) of the cleaning compositions of this disclosure.

The cleaning compositions of the present disclosure further include water. Preferably, the water is de-ionized and ultra-pure, contains no organic contaminants and has a minimum resistivity of about 4 to about 17 mega Ohms. More preferably, the resistivity of the water is at least 17 mega Ohms.

In some embodiments, water can be at least about 20% by weight (e.g., at least about 25% by weight, at least about 30% by weight, at least about 35% by weight, or at least about 40% by weight) and/or at most about 50% by weight (e.g., at most about 45% by weight, at most about 40% by weight, at most about 35% by weight, or at most about 30% by weight) of the cleaning compositions of this disclosure.

In some embodiments, the cleaning compositions of this disclosure can optionally contain at least one pH adjusting agent (e.g., an acid or a base) to control the pH to from about 8 to about 11. In some embodiments, the compositions of this disclosure can have a pH of at least about 8 (e.g., at least about 8.5, at least about 9, at least about 9.5, or at least about 10) to at most about 11 (e.g., at most about 10.5, at most about 10, at most about 9.5, or at most about 9). Without wishing to be bound by theory, it is believed that a cleaning composition having a pH lower than 8 or higher than 11 would increase the etch rate of certain metals or dielectric materials to an undesirable level. The effective pH can vary depending on the types and amounts of the ingredients used in the cleaning compositions described herein.

The amount of the pH adjusting agent required, if any, can vary as the concentrations of the other components (e.g., the hydroxylamine, the alkylsulfonic acid, the aminoalcohol, and the corrosion inhibitor) are varied in different formulations, and as a function of the molecular weight of the particular pH adjusting agent employed. In general, the pH adjusting agent concentration ranges from about 1% to about 10% by weight of the cleaning composition. In some embodiments, the cleaning compositions of this disclosure include at least about 1% by weight (e.g., at least about 1.5% by weight, at least about 2% by weight, or at least about 2.5% by weight) and/or at most about 10% by weight (e.g., at most about 9% by weight, at most about 8% by weight, at most about 7% by weight, at most about 6% by weight, or at most about 5% by weight) the pH adjusting agent.

In some embodiments, the pH adjusting agent is free of any metal ion (except for a trace amount of metal ion impurities). Suitable metal ion free pH adjusting agents include acids and bases. Suitable acids that can be used as a pH adjusting agent include carboxylic acids and sulfonic acids. Exemplary carboxylic acid include, but are not limited to, monocarboxylic acids, bicarboxylic acids, tricarboxylic acids, α-hydroxyacids and β-hydroxyacids of monocarboxylic acids, α-hydroxyacids or β-hydroxyacids of bicarboxylic acids, or α-hydroxyacids and β-hydroxyacids of tricarboxylic acids. In some embodiments, the at least one carboxylic acid includes citric acid, maleic acid, fumaric acid, lactic acid, glycolic acid, oxalic acid, tartaric acid, succinic acid, or benzoic acid. Examples of sulfonic acids of include, but are not limited to, methanesulfonic acid, trifluoromethanesulfonic acid, ethanesulfonic acid, trifluoroethanesulfonic acid, perfluoroethylsulfonic acid, perfluoro(ethoxyethane)sulfonic acid, perfluoro(methoxyethane)sulfonic acid, dodecylsulfonic acid, perfluorododecylsulfonic acid, butanesulfonic acid, perfluorobutanesulfonic acid, propanesulfonic acid, perfluoropropanesulfonic acid, octylsulfonic acid, pefluorooctanesulfonic acid, methanedisulfonic acid, 2-methylpropanesulfonic acid, cyclohexylsulfonic acid, camphorsulfonic acids, perfluorohexanesulfonic acid, ethanedisulfonic acid, benzylsulfonic acid, hydroxyphenylmethanesulfonic acid, naphthylmethanesulfonic acid, norbornanesulfonic acids. benzenesulfonic acid, chlorobenzenesulfonic acids, bromobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids (e.g., p-toluenesulfonic acid), methylchlorobenzenesulfonic acids, dodecylbenzenesulfonic acids, butylbenzenesulfonic acids, cyclohexylbenzenesulfonic acids, picrylsulfonic acid, dichlorobenzenesulfonic acids, dibromobenzenesulfonic acids, and 2,4,5-trichlorobenzenesulfonic acid.

Suitable bases that can be used as a pH adjusting agent include ammonium hydroxide, quaternary ammonium hydroxides, monoamines (including alkanolamines), imines (such as 1,8-diazabicyclo[5.4.0]-7-undecene (DBU) and 1,5-diazabicyclo[4.3.0]-5-nonene), and guanidine salts (such as guanidine carbonate). Examples of suitable quaternary ammonium hydroxides include, but are not limited to, tetramethyl ammonium hydroxide, tetraethyl ammonium hydroxide, tetrapropyl ammonium hydroxide, tetrabutyl ammonium hydroxide, dimethyldiethylammonium hydroxide, choline, tetraethanolammonium hydroxide, benzyltrimethylammonium hydroxide, benzyltriethylammonium hydroxide, and benzyltributylammonium hydroxide. Examples of suitable monoamines include, but are not limited to, triethylamine, tributylamine, tripentylamine, ethanolamine, diethanolamine, diethylamine, butylamine, dibutylamine, and benzylamine.

In addition, in some embodiments, the cleaning compositions of the present disclosure may contain additives such as, additional pH adjusting agents, additional corrosion inhibitors, additional organic solvents, surfactants, biocides, and defoaming agents as optional components. Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference).

In some embodiments, the cleaning compositions of the present disclosure may specifically exclude one or more of the additive components, in any combination, if more than one. Such components are selected from the group consisting of polymers, oxygen scavengers, quaternary ammonium salts including quaternary ammonium hydroxides, amines, alkaline bases (such as NaOH, KOH, LiOH, $Mg(OH)_2$, and $Ca(OH)_2$), surfactants other than a defoamer, a defoamer, fluoride-containing compounds, oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, hydroxycarboxylic acids, carboxylic and polycarboxylic acids (e.g., those lacking amino groups), silanes (e.g., alkoxysilanes), cyclic compounds (e.g., cyclic compounds containing at least two rings, such as substituted or unsubstituted naphthalenes, or substituted or unsubstituted biphenylethers), chelating agents, non-azole corrosion inhibitors, buffering agents, guanidine, guanidine salts, acids such as organic acids and inorganic acids (e.g., sulfonic acids, sulfuric acid, sulfurous acid, nitrous acid, nitric acid, phosphorous acid, and phosphoric acid), pyrrolidone, polyvinyl pyrrolidone, metal salts (e.g., metal halides such as metal halides of the formula $W_zMX_y$, wherein W is selected from H, an alkali or alkaline earth metal, and a metal-ion-free hydroxide base moiety; M is a metal selected from the group consisting of Si, Ge, Sn, Pt, P, B, Au, Ir, Os, Cr, Ti, Zr, Rh, Ru and Sb; y is from 4 to 6; and z is 1, 2, or 3), and corrosion inhibitors other than those described in this disclosure.

The cleaning compositions described herein can be prepared by simply mixing the components together, or can be prepared by blending two compositions in a kit.

In some embodiments, the cleaning compositions of the present disclosure are not specifically designed to remove bulk photoresist films from semiconductor substrates. Rather, the cleaning compositions of the present disclosure can be designed to remove all residues after bulk resist removal by dry or wet stripping methods. Therefore, in some embodiments, the cleaning method of the present disclosure is preferably employed after a dry or wet photoresist stripping process. This photoresist stripping process is generally preceded by a pattern transfer process, such as an etch or implant process, or it is done to correct mask errors before pattern transfer. The chemical makeup of the residue will depend on the process or processes preceding the cleaning step.

Any suitable dry stripping process can be used to remove bulk resist from semiconductor substrates. Examples of suitable dry stripping processes include oxygen based plasma ashing, such as a fluorine/oxygen plasma or a $N_2/H_2$ plasma; ozone gas phase-treatment; fluorine plasma treatment, hot $H_2$ gas treatment (such as that described in U.S.

Pat. No. 5,691,117 incorporated herein by reference in its entirety), and the like. In addition, any conventional organic wet stripping solution known to a person skilled in the art can be used to remove bulk resist from semiconductor substrates.

A preferred stripping process used in combination with the cleaning method of the present disclosure is a dry stripping process. Preferably, this dry stripping process is the oxygen based plasma ashing process. This process removes most of the photoresist from the semiconductor substrate by applying a reactive-oxygen atmosphere at elevated temperatures (typically 250° C.) at vacuum conditions (i.e., 1 torr). Organic materials are oxidized by this process and are removed with the process gas. However, this process generally does not remove all inorganic or organometallic contamination from the semiconductor substrate. A subsequent cleaning of the semiconductor substrate with the cleaning composition of the present disclosure is typically necessary to remove those residues.

In some embodiments, the present disclosure features methods of cleaning residues from a semiconductor substrate. Such methods can be performed, for example, by contacting a semiconductor substrate containing post etch residues and/or post ash residues with a cleaning composition described herein. The method can further include rinsing the semiconductor substrate with a rinse solvent after the contacting step and/or drying the semiconductor substrate after the rinsing step. In some embodiments, the semiconductor substrate can further include at least one material (e.g., an exposed material) or a layer of the at least one material, where the material is selected from the group consisting of Cu, Co, W, AlOx, AlN, AlOxNy, Ti, TiN, Ta, TaN, TiOx, ZrOx, HfOx, and TaOx.

In some embodiments, the cleaning method includes the steps of: (A) providing a semiconductor substrate containing post etch and/or post ash residues; (B) contacting said semiconductor substrate with a cleaning composition described herein; (C) rinsing said semiconductor substrate with a suitable rinse solvent; and (D) optionally, drying said semiconductor substrate by any suitable means that removes the rinse solvent and does not compromise the integrity of said semiconductor substrate. In some embodiments, the cleaning method further includes forming a semiconductor device (e.g., an integrated circuit device such as a semiconductor chip) from the semiconductor substrate obtained by the method described above.

In some embodiments, the cleaning method does not substantially remove Co, aluminum oxides (AlOx or $Al_2O_3$), silicon oxides (SiOx), zirconium oxide (ZrOx), TiN, SiN, poly-Si, or Cu in the semiconductor substrate. For example, in some embodiments, the method removes no more than about 5% by weight (e.g., no more than about 3% by weight, no more than about 1% by weight, no more than about 0.5% by weight, or no more than about 0.1% by weight) of any of the above materials in the semiconductor substrate.

The semiconductor substrates to be cleaned in this method can contain organic and organometallic residues, and additionally, a range of metal oxides that need to be removed. Semiconductor substrates typically are constructed of silicon, silicon germanium, Group III-V compounds like GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, and silicon, titanium nitride, tantalum nitride, tungsten, and their alloys. The semiconductor substrate can also contain layers of interlayer dielectrics, silicon oxide, silicon nitride, silicon carbide, titanium oxide, and carbon doped silicon oxides.

The semiconductor substrate can be contacted with a cleaning composition by any suitable method, such as placing the cleaning composition into a tank and immersing and/or submerging the semiconductor substrates into the cleaning composition, spraying the cleaning composition onto the semiconductor substrate, streaming the cleaning composition onto the semiconductor substrate, or any combinations thereof. Preferably, the semiconductor substrates are immersed into the cleaning composition.

The cleaning compositions of the present disclosure may be effectively used up to a temperature of about 90° C. (e.g., from about 25° C. to about 80° C., from about 30° C. to about 60° C., or from about 40° C. to about 60° C.).

Similarly, cleaning times can vary over a wide range depending on the particular cleaning method and temperature employed. When cleaning in an immersion batch type process, a suitable time range is, for example, up to about 60 minutes (e.g., from about 1 minute to about 60 minutes, from about 3 minutes to about 20 minutes, or from about 4 minutes to about 15 minutes).

Cleaning times for a single wafer process may range from about 10 seconds to about 5 minutes (e.g., from about 15 seconds to about 4 minutes, from about 15 seconds to about 3 minutes, or from about 20 seconds to about 2 minutes).

To further promote the cleaning ability of the cleaning composition of the present disclosure, mechanical agitation means can be employed. Examples of suitable agitation means include circulation of the cleaning composition over the substrate, streaming or spraying the cleaning composition over the substrate, and ultrasonic or megasonic agitation during the cleaning process. The orientation of the semiconductor substrate relative to the ground may be at any angle. Horizontal or vertical orientations are preferred.

The cleaning compositions of the present disclosure can be used in conventional cleaning tools known to those skilled in the art. A significant advantage of the compositions of the present disclosure is that they include relatively non-toxic, non-corrosive, and non-reactive components in whole and in part, whereby the compositions are stable in a wide range of temperatures and process times. The compositions of the present disclosure are chemically compatible with practically all materials used to construct existing and proposed semiconductor wafer cleaning process tools for batch and single wafer cleaning.

Subsequent to the cleaning, the semiconductor substrate can be rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, aqueous rinses with pH>8 (such as dilute aqueous ammonium hydroxide) may be employed. Preferred examples of rinse solvents include, but are not limited to, dilute aqueous ammonium hydroxide, DI water, methanol, ethanol and isopropyl alcohol. The solvent may be applied using means similar to that used in applying a cleaning composition described herein. The cleaning composition may have been removed from the semiconductor substrate prior to the start of the rinsing step or it may still be in contact with the semiconductor substrate at the start of the rinsing step. Preferably, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Marangoni drying, Rotagoni drying, IPA drying or any combinations thereof. Drying times will be dependent on the specific method employed but are typically on the order of 30 seconds up to several minutes.

In some embodiments, a method of manufacturing an integrated device using a cleaning composition described herein can include the following steps. First, a layer of a photoresist is applied to a semiconductor substrate. The semiconductor substrate thus obtained can then undergo a pattern transfer process, such as an etch or implant process, to form an integrated circuit. The bulk of the photoresist can then be removed by a dry or wet stripping method (e.g., an oxygen based plasma ashing process). Remaining residues on the semiconductor substrate can then be removed using a cleaning composition described herein in the manner described above. The semiconductor substrate can subsequently be processed to form one or more additional circuits on the substrate or can be processed to form into a semiconductor chip by, for example, assembling (e.g., dicing and bonding) and packaging (e.g., chip sealing).

The contents of all publications cited herein (e.g., patents, patent application publications, and articles) are hereby incorporated by reference in their entirety.

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a 1 inch stirring bar at 300 rpm unless otherwise noted.

General Procedure 1

Formulation Blending

Samples of cleaning compositions were prepared by adding, while stirring, to the calculated amount of organic solvent the remaining components of the formulation. After a uniform solution was achieved, optional additives, if used, were added.

General Procedure 2

Cleaning Evaluation with Beaker Test

The cleaning of PER (Post Etch Residue) from a substrate was carried out with the described cleaning compositions using a multilayered semiconductor substrate of photoresist/TiOx/SiN/Co/ILD (ILD=Inter Layer Dielectric) or photoresist/TiOx/SiN/W/ILD that had been patterned lithographically, etched in a plasma metal etcher, and followed by oxygen plasma ashing to remove the top layer of photoresist completely.

The test coupons were held using 4" long plastic locking tweezers, whereby the coupon could then be suspended into a 500 ml volume beaker containing approximately 200 milliliters of the cleaning compositions of the present disclosure. Prior to immersion of the coupon into the cleaning composition, the composition was pre-heated to the desired test condition temperature (typically 40° C. or 70° C. as noted) with controlled stirring. The cleaning tests were then carried out by placing the coupon which was held by the plastic tweezers into the heated composition in such a way that the PER layer containing side of the coupon faced the stir bar. The coupon was left static in the cleaning composition for a time period (typically 2 to 5 minutes) while the composition was kept at the test temperature under controlled stirring. When the desired cleaning time was completed, the coupon was quickly removed from the cleaning composition and placed in a 500 ml plastic beaker filled with approximately 400 ml of DI water at ambient temperature (~17° C.) with gentle stirring. The coupon was left in the beaker of DI water for approximately 15 seconds, and then quickly removed, followed by a rinse in isopropanol for about 30 seconds. The coupon was immediately exposed to a nitrogen gas stream from a hand held nitrogen blowing gun, which caused any droplets on the coupon surface to be blown off the coupon, and further, to completely dry the coupon device surface. Following this final nitrogen drying step, the coupon was removed from the plastic tweezers holder and placed into a covered plastic carrier with the device side up for short term storage. The scanning electron microscopy (SEM) images were then collected for key features on the cleaned test coupon device surface.

General Procedure 3

Materials Compatibility Evaluation with Beaker Test

The blankets W on silicon substrate, TiOx on $SiO_2$ on silicon substrate, SiN on silicon substrate, $Al_2O_3$ on silicon substrate, TiN on silicon substrate, ILD on silicon substrate were diced into approximately 1 inch×1 inch square test coupons for the materials compatibility tests. The test coupons were initially measured for thickness or sheet resistance by the 4-point probe, CDE Resmap 273 for metallic film (Co, W), or by Elipsometry for dielectric film (TiOx, SiN and ILD) using a Woollam M-2000X. The test coupons were then installed on the 4" long plastic locking tweezers and treated as described in the cleaning procedure in General Procedure 3 with the Co, W, TiOx, SiN, or ILD layer containing side of the coupon faced the stir bar for 10 minutes.

After the final nitrogen drying step, the coupon was removed from the plastic tweezers holder and placed into a covered plastic carrier. The post-thickness or sheet resistance was then collected on the post-processing test coupon surface by the 4-point probe, CDE Resmap 273 for metallic film (Co and W) or by Elipsometry for dielectric film (TiOx, SiN and ILD) using a Woollam M-2000X.

Example 1

Formulation Examples 1-11 (FE-1 to FE-11) and Comparative Formulation Examples 1-16 (CFE-1 to CFE-16) were prepared according to General Procedure 1, and evaluated according to General Procedures 2 and 3. The formulations are summarized in Table 1 and the cleaning results and the etch rates (ER) (Angstroms/minute) of Co, W, AlOx, TiOx, and B-doped W are summarized in Table 2. The results in Table 2 were obtained at a cleaning temperature of 65° C. within a cleaning time of 3-6 minutes.

TABLE 1

| Ex. | HA | PG | MEA | pH Adjusting agent | IA or its salt | 5MBTA | Additive | DI Water | Total | PH |
|---|---|---|---|---|---|---|---|---|---|---|
| FE-1 | 10.00% | 44.35% | 9.25% | — | IAAS 0.90% | 0.50% | — | 35.00% | 100.00% | 10.6 |
| FE-2 | 10.00% | 48.60% | 5.00% | — | IAAS 0.90% | 0.50% | — | 35.00% | 100.00% | 10.3 |
| FE-3 | 10.00% | 41.35% | 7.00% | MSA 5.25% | IAAS 0.90% | 0.50% | — | 35.00% | 100.00% | 9.3 |
| FE-4 | 10.00% | 41.35% | 7.00% | MSA 5.25% | IA 0.90% | 0.50% | — | 35.00% | 100.00% | 9.3 |
| FE-5 | 10.00% | 44.10% | 7.00% | MSA 2.50% | IA 0.90% | 0.50% | — | 35.00% | 100.00% | 10.5 |
| FE-6 | 8.00% | 45.10% | 8.00% | MSA 2.50% | IA 0.90% | 0.50% | — | 35.00% | 100.00% | 10.6 |
| FE-7 | 10.00% | 41.75% | 7.00% | MSA 5.25% | IAAS 0.50% | 0.50% | — | 35.00% | 100.00% | 9.3 |
| FE-8 | 10.00% | 42.25% | 7.00% | MSA 5.25% | — | 0.50% | — | 35.00% | 100.00% | 9.3 |
| FE-9 | 10.00% | 41.77% | 7.00% | MSA 5.43% | IA 0.30% | 0.50% | — | 35.00% | 100.00% | 9.3 |
| FE-10 | 10.00% | 44.87% | 7.00% | HCl 1.73% | IAAS 0.50% | 0.50% | — | 35.00% | 100.00% | 9.3 |
| FE-11 | 10.00% | 36.35% | 7.00% | MSA 5.25% | IAAS 0.90% | 0.50% | — | 40.00% | 100.00% | 9.3 |
| CFE-1 | 4.00% | 58.92% | — | DBU 1.08% | IAAS 0.50% | 0.50% | — | 35.00% | 100.00% | 10.1 |
| CFE-2 | 6.00% | 56.93% | — | DBU 1.07% | IAAS 0.50% | 0.50% | — | 35.00% | 100.00% | 10.1 |
| CFE-3 | 8.00% | 54.92% | — | DBU 1.08% | IAAS 0.50% | 0.50% | — | 35.00% | 100.00% | 10.1 |
| CFE-4 | 4.00% | 58.52% | — | DBU 1.08% | IAAS 0.90% | 0.50% | — | 35.00% | 100.00% | 10.1 |
| CFE-5 | 6.00% | 56.53% | — | DBU 1.07% | IAAS 0.50% | 0.50% | — | 35.00% | 100.00% | 10.1 |
| CFE-6 | 8.00% | 54.52% | — | DBU 1.08% | IAAS 0.90% | 0.50% | — | 35.00% | 100.00% | 10.1 |
| CFE-7 | 10.00% | 52.13% | — | DBU 1.46% | IAAS 0.90% | 0.50% | $(NH_4)_2TiF_6$ 0.007% | 35.00% | 100.00% | 10.1 |
| CFE-8 | 10.00% | 52.87% | — | DBU 1.12% | IAAS 0.90% | 0.10% | $(NH_4)_2TiF_6$ 0.007% | 35.00% | 100.00% | 10.1 |
| CFE-9 | 10.00% | 52.87% | — | DBU 1.12% | IAAS 0.90% | 0.10% | $(NH_4)_2TiF_6$ 0.014% | 35.00% | 100.00% | 10.1 |
| CFE-10 | 10.00% | 52.67% | — | DBU 1.12% | IAAS 0.90% | 0.30% | $(NH_4)_2TiF_6$ 0.014% | 35.00% | 100.00% | 10.1 |
| CFE-11 | 10.00% | 52.37% | — | DBU 1.42% | IAAS 0.90% | 0.30% | $(NH_4)_2TiF_6$ 0.014% | 35.00% | 100.00% | 10.1 |
| CFE-12 | 10.00% | 31.59% | 18.50% | MSA 3.51% | IAAS 0.90% | 0.50% | — | 35.00% | 100.00% | 10.2 |
| CFE-13 | 10.00% | 51.10% | 2.50% | — | IAAS 0.90% | 0.50% | — | 35.00% | 100.00% | 10.1 |
| CFE-14 | 10.00% | 58.60% | 5.00% | — | IA 0.90% | 0.50% | — | 25.00% | 100.00% | 10.1 |
| CFE-15 | 10.00% | 61.60% | 4.00% | — | IA 0.90% | 0.50% | — | 25.00% | 100.00% | 10.0 |
| CFE-16 | 10.00% | 46.15% | 5.00% | MSA 2.45% | IAAS 0.90% | 0.50% | — | 35.00% | 100.00% | 9.6 |

HA = Hydroxylamine; PG = Propylene Glycol; MEA = Monoethanolamine; MSA = Methanesulfonic acid; IA = Isethionic acid; IAAS = Isethionic acid $NH_4$ salt; 5MBTA = 5-methylbenzothiazole; DBU = 1,8-diazabicyclo[5.4.0]-7-undecene.

TABLE 2

| Ex. | Co (Å/min) | W (Å/min) | AlOx (Å/min) | TiOx (Å/min) | B-doped W (Å/min) | Cleaning |
|---|---|---|---|---|---|---|
| FE-1 | N/A | N/A | 3.90 | N/A | N/A | Clean in 4 minutes |
| FE-2 | N/A | N/A | 2.90 | N/A | N/A | Clean in 4 minutes |
| FE-3 | N/A | N/A | 1.60 | N/A | N/A | Clean in 3.5 minutes |
| FE-4 | 0.6 | 4.2 | 1.0 | 0.4 | 60.3 | Clean in 3.5 minutes |
| FE-5 | 1.0 | 5.7 | 2.1 | 0.7 | 74.1 | Clean in 3.5 minutes |
| FE-6 | 0.7 | 4.8 | 1.8 | 0.5 | 68.5 | 85-90% Clean |
| FE-7 | 0.7 | 4.6 | 1.2 | 0.5 | 70.0 | Clean in 4 minutes |
| FE-8 | 0.9 | 5.8 | 2.2 | 1.0 | 95.5 | Clean in 4 minutes |
| FE-9 | N/A | N/A | 1.5 | N/A | N/A | Clean in 4 minutes |
| FE-10 | N/A | N/A | 1.7 | N/A | N/A | Clean in 3.5 minutes |

TABLE 2-continued

| Ex. | Co (Å/min) | W (Å/min) | AlOx (Å/min) | TiOx (Å/min) | B-doped W (Å/min) | Cleaning |
|---|---|---|---|---|---|---|
| FE-11 | N/A | N/A | 2.4 | N/A | N/A | Clean in 3.5 minutes |
| CFE-1 | N/A | N/A | N/A | N/A | N/A | Not clean in 6 minutes |
| CFE-2 | N/A | N/A | N/A | N/A | N/A | Not clean in 6 minutes |
| CFE-3 | N/A | N/A | N/A | N/A | N/A | Not clean in 6 minutes |
| CFE-4 | N/A | N/A | N/A | N/A | N/A | Not clean in 6 minutes |
| CFE-5 | N/A | N/A | N/A | N/A | N/A | Not clean in 6 minutes |
| CFE-6 | N/A | N/A | N/A | N/A | N/A | Not clean in 6 minutes |
| CFE-7 | N/A | N/A | N/A | N/A | N/A | 85-90% clean |
| CFE-8 | N/A | N/A | N/A | N/A | N/A | 85-90% clean |
| CFE-9 | N/A | N/A | N/A | N/A | N/A | 85-90% clean |
| CFE-10 | N/A | N/A | N/A | N/A | N/A | 85-90% clean |
| CFE-11 | N/A | N/A | N/A | N/A | N/A | 85-90% clean |
| CFE-12 | N/A | N/A | 8.91 | N/A | N/A | Clean in 4 minutes |
| CFE-13 | N/A | N/A | 1.86 | N/A | N/A | Not clean in 6 minutes |
| CFE-14 | 1.8 | 5.3 | 1.21 | 0.61 | 61.5 | Not clean in 6 minutes |
| CFE-15 | 0.8 | 4.9 | 1.02 | 0.49 | 55.2 | Not clean in 6 minutes |
| CFE-16 | N/A | N/A | 1.52 | N/A | N/A | Not clean in 6 minutes |

N/A = Not available.

As shown in Tables 1 and 2, formulations FE-1 to FE-11 (which contained appropriate amounts of monoethanolamine and isethionic acid or its salt) exhibited both excellent capability of cleaning post etch residues and compatibility (i.e., relatively low etch rates) with semiconductor materials (especially AlOx) that may be exposed in a cleaning process. By contrast, formulations CFE-1 to CFE-11 (which do not contain monoethanolamine) did not adequately clean post etch residues. Formulation CFE-12 contained a relatively high amount of monoethanolamine. Although formulation CFE-12 cleaned post etch residues, it exhibited a relatively high AlOx etch rate (i.e., a relatively low compatibility with AlOx). Formulations CFE-13 and CFE-15 contained a relatively low amount of monoethanolamine. The results showed that, although these two formulations exhibited a relatively low AlOx etch rate, they did not adequately clean post etch residues. Formulation CFE-14 contained a relatively low amount of DI water. The results showed that, although this formulation exhibited a relatively low AlOx etch rate, it did not adequately clean post etch residues.

Other embodiments are within the scope of the following claims.

What is claimed is:

1. A cleaning composition, comprising:
   1) hydroxylamine in an amount of at most about 15% by weight of the composition;
   2) an aminoalcohol comprising at least two amino groups and at least one hydroxyl group, the aminoalcohol being in an amount of at most about 8% by weight of the composition;
   3) hexylene glycol in an amount of at most about 50% by weight of the composition; and
   4) water;
   wherein the pH of the composition is from about 8 to about 11.

2. The composition of claim 1, wherein the hydroxylamine is at least about 6% by weight of the composition.

3. The composition of claim 1, wherein the hexylene glycol is at most about 30% by weight of the composition.

4. The composition of claim 1, wherein the water is at least about 20% by weight of the composition.

5. The composition of claim 1, wherein the water is at least about 40% by weight of the composition.

6. The composition of claim 1, wherein the water is at most about 50% by weight of the composition.

7. The composition of claim 1, further comprising at least one corrosion inhibitor.

8. The composition of claim 7, wherein the at least one corrosion inhibitor comprises benzotriazole optionally substituted by at least one substituent selected from the group consisting of alkyl groups, aryl groups, halogen groups, amino groups, nitro groups, alkoxy groups, and hydroxyl groups.

9. The composition of claim 7, wherein the at least one corrosion inhibitor comprises a compound selected from the group consisting of benzotriazole, 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methylbenzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-m ethoxybenzotriazole, 5-hydroxybenzotriazole, dihydroxypropylbenzotriazole, 1-[N,N-bis(2-ethylhexyl) aminomethyl]-benzotriazole, 5-t-butyl benzotriazole, 5-(1', 1'-diimethylpropyl)-benzotriazole, 5-(1',1',3'-trimethylbutyl)benzotriazole, 5-n-octyl benzotriazole, and 5-(1',1',3', 3'-tetramethylbutyl)benzotriazole.

10. The composition of claim 7, wherein the at least one corrosion inhibitor is from about 0.1% by weight to about 2% by weight of the composition.

11. The composition of claim 1, further comprising at least one pH adjusting agent, wherein the at least one pH adjusting agent comprises an acid.

12. The composition of claim 11, wherein the at least one pH adjusting agent is from about 1% by weight to about 10% by weight of the composition.

13. The composition of claim 1, wherein
   the hydroxylamine is in an amount of from about 6% by weight to about 15% by weight of the composition;
   the hexylene glycol is in an amount of at most about 30% by weight of the composition; and the water is at least about 20% by weight of the composition.

14. The composition of claim 1, wherein the composition is free of a metal halide.

15. A method, comprising:
    contacting a semiconductor substrate containing post etch residues or post ashing residues with a cleaning composition of claim 1.

16. The method of claim 15, wherein the semiconductor substrate further comprises at least one material selected from the group consisting of Cu, Co, W, AlOx, AlN, AlOxNy, Ti, TiN, Ta, TaN, TiOx, ZrOx, HfOx, and TaOx.

17. The method of claim 15, further comprising rinsing the semiconductor substrate with a rinse solvent after the contacting step.

18. The method of claim 17, further comprising drying the semiconductor substrate after the rinsing step.

19. The method of claim 15, further comprising forming a semiconductor device from the semiconductor substrate.

\* \* \* \* \*